(12) United States Patent
Okamura et al.

(10) Patent No.: US 7,518,137 B2
(45) Date of Patent: Apr. 14, 2009

(54) SHIELD MATERIAL

(75) Inventors: Kenji Okamura, Fukuoka (JP);
Masahiro Yamauchi, Fukuoka (JP);
Shigeru Matsuo, Fukuoka (JP); Shigeya Sakaguchi, Fukuoka (JP)

(73) Assignee: Nippon Tungsten Co. Ltd (JP)

( * ) Notice: Subject to any disclaimer, the term of this patent is extended or adjusted under 35 U.S.C. 154(b) by 363 days.

(21) Appl. No.: 10/549,835

(22) PCT Filed: Mar. 18, 2003

(86) PCT No.: PCT/JP03/03288

§ 371 (c)(1),
(2), (4) Date: Sep. 16, 2005

(87) PCT Pub. No.: WO2004/084234

PCT Pub. Date: Sep. 30, 2004

(65) Prior Publication Data

US 2006/0251203 A1     Nov. 9, 2006

(51) Int. Cl.
*G21C 11/00* (2006.01)

(52) U.S. Cl. ............. 250/515.1; 250/516.1; 250/518.1; 250/519.1; 250/505.1

(58) Field of Classification Search .... 250/505.1–519.1
See application file for complete search history.

(56) References Cited

U.S. PATENT DOCUMENTS

| | | | | |
|---|---|---|---|---|
| 3,062,678 | A | * | 11/1962 | McCluer .................... 442/68 |
| 3,622,432 | A | * | 11/1971 | McCluer et al. ............ 428/215 |
| 3,895,143 | A | * | 7/1975 | Tarlow ..................... 428/40.9 |
| 4,923,741 | A | * | 5/1990 | Kosmo et al. ............... 442/187 |
| 7,274,031 | B2 | * | 9/2007 | Smith ...................... 250/515.1 |
| 2002/0077439 | A1 | * | 6/2002 | Sakurai et al. ............. 528/10 |
| 2002/0179860 | A1 | * | 12/2002 | Smith ...................... 250/515.1 |

FOREIGN PATENT DOCUMENTS

| | | |
|---|---|---|
| JP | 53-36700 | 3/1978 |
| JP | 62-012897 | 1/1987 |
| JP | 62-252405 | 11/1987 |

(Continued)

*Primary Examiner*—Jack I Berman
*Assistant Examiner*—Andrew Smyth
(74) *Attorney, Agent, or Firm*—Fleit Gibbons Gutman Bongini & Bianco PL; Paul D. Bianco; Martin Fleit

(57) ABSTRACT

Disclosed is a fire-resistant lead-free shield material having high shielding ability against nuclear or electromagnetic radiation, and excellent bending workability and handling performance. The shield material comprises a composite material consisting of an organic material and a metal or metal compound having a nuclear or electromagnetic radiation-shielding ability. The composite material is formed into a given shape, such as a plate shape, and wrapped with a cloth-like sheet formed of glass fibers, metal fibers or carbon fibers. Alternatively, the shield material comprises a shielding element consisting of an elastic polymeric organic compound and a particle having a nuclear or electromagnetic radiation-shielding ability, such a heavy metal or ferrite. The shield material also includes either one of a film made of polyethylene, nylon, polyester or metal, a wire mesh formed of nylon fiber or metal fiber, and a plate- or rod-shaped member having a surface formed with a protrusion, which is compression-bonded onto or in the vicinity of a surface of the shielding element, or inside the shielding element.

11 Claims, 2 Drawing Sheets

FOREIGN PATENT DOCUMENTS

| | | |
|---|---|---|
| JP | 62-259097 | 11/1987 |
| JP | 64-2200 | 1/1989 |
| JP | 02-140500 | 11/1990 |
| JP | 04-118594 | 4/1992 |
| JP | 07-229999 | 8/1995 |
| JP | 08-122492 | 5/1996 |
| JP | 2002-365393 | 12/2002 |
| JP | 2003-004893 | 1/2003 |

* cited by examiner

SHIELD MATERIAL

TECHNICAL FIELD

The present invention relates to a shield material for use as a shield against nuclear or electromagnetic radiation.

BACKGROUND ART

Heretofore, lead and lead alloys have been used as a material for a nuclear radiation shield, in terms of high density and excellent radiation-shielding ability. At the same time, the lead and lead alloys involves a problem about poor availability as a shield material for use in an area to be subjected to plasticity working, when the lead or lead alloy-based material has a large thickness, because of its hardly shaping ability during a deformation process. Recent years, an aggregate of thin fibrous lead strands, so-called lead wools, has been increasingly used as a lead-based shield material being capable of shaping. While the use of lead wools can facilitate deformation and shaping, the material becomes more reduced in density along with increase in the degree of deformation and causes a problem about deterioration in radiation-shielding performance. Moreover, lead itself is harmful to humans, and the use of lead has been increasingly restricted. Thus, there is the need for developing a lead-free material usable as a radiation shield.

A heavy-metal plate and a resin-based material prepared by kneading a radiation-shielding powder having a radiation-shielding ability as its own property, such as iron oxides have been used for shielding against electromagnetic radiation. However, these materials have difficulties in being shaped through a deformation process, and the resin-based material containing the radiation-shielding powder kneaded thereinto has another disadvantage about fragility and the need for paying particular attention to its handling.

So as to solve disadvantages of a radiation shield material as an alternative to the above conventional lead-based material and to meet the need for environmental public health and flexibility, a radiation shield material comprising a composite material consisting of a metal and an organic material is disclosed in Japanese Patent Laid-Open Publication No. 08-122492.

However, the fact of the matter is that the composite material consisting of the metal and organic material is liable to suffer breakage or cracks during handling and thereby required to pay particular attention to its handling as heretofore. While the strength or content of the organic material may be increased as measures against this problem, such measures will spoil its original flexibility and density, and lead to deterioration in radiation-shielding performance. Moreover, the composite material consisting of the metal and organic material disadvantageously catches fire easily in the event of a fire or abnormal overheating.

DISCLOSURE OF THE INVENTION

It is a general object of the present invention to solve the aforementioned problems of the conventional shield material.

Specifically, it is an object of the present invention to obtain a shield material having a high nuclear and electromagnetic radiation-shielding ability without using lead.

It is another object of the present invention to obtain a shield material having a high density without becoming bulky.

It is further another object of the present invention to provide a shield material comprising a composite material consisting of a radiation-shielding material and an organic material, which is capable of providing higher strength and enhanced non-breakability against tearing and/or shock to facilitate easy-handling.

It is still further another object of the present invention to obtain a lead-free shield material which is hardly broken or cracked during bending or folding.

According to a first aspect of the present invention, there is provided a shield material comprising: a flexible formed element having, for example, a plate-like shape, of a composite material consisting of an organic material as a base material and a dispersed powder material having a nuclear or electromagnetic radiation-shielding ability; and a cloth-like sheet formed of a flame-resistant fiber overwrapping said flexible formed element, whereby flame resistance and strength during handling is improved. In addition, the shield material of the present invention has excellent flexibility enough to facilitate shaping during deformation working. Thus, according to the present invention, the shield material makes it possible to closely cover a target even if it has a complicated shape so as to shield against various nuclear or electromagnetic radiations emitted from the target having a complicated surface profile.

According to another aspect of the present invention, a shield material improved of strength against bending or folding is obtained by attaching a reinforcing material onto a surface or inside the composite element consisting of particles having a nuclear or electromagnetic radiation-shielding ability and polymeric organic compound particles having elasticity.

Each of the organic material serving as a base material and the radiation-shielding material to be dispersedly mixed with the organic material may be appropriately selected in consideration with a required radiation-shielding ability and conditions employed, such as environmental temperature.

Particularly, as for shielding against nuclear radiation, a nuclear radiation-shielding ability is proportional to the density of a nuclear radiation-shielding material. For example, tungsten or molybdenum has a high density and a significantly high nuclear radiation-shielding ability, about 1.4 times greater than that of lead in equivalent volume. And, similarly, one or more of tungsten carbide, other tungsten alloy or compound and other heavy-metal alloy or compound may be mixed with other high-density powder, such as tungsten or molybdenum, are expected to obtain the same effect.

As for shielding against electromagnetic radiation, as the shielding dispersion material to be mixed with an organic material, magnetic powder material, such as iron material, iron oxide, titanium oxide or barium titanate, may be suitably used. Generally, either one of an electromagnetic radiation-reflecting function of a surface of the shield material and an electromagnetic radiation-absorbing function of the radiation-shielding material is utilized to shield against electromagnetic radiation. Particularly, when the shield material is applied to an electromagnetic radiation measurement device, it is desirable to utilize the absorption-based shielding, because reflected electromagnetic radiation in the reflection-based shielding is likely to exert adverse affects on another device. Thus, a magnetic metallic compound capable of absorbing electromagnetic radiation through conversion to heat may be suitably used as the shield material.

An organic material used in the present invention is preferable to have flexibility and conformability to the aforementioned metal and metal oxide. An elastomer resin, a vulcanized rubber or a soft plastic is preferably used.

As the flame-resistant cloth-like sheet for wrapping over the flexible element formed of the composite material having the radiation-shielding ability, a fiber member excellent in tearing strength, flexibility and flame resistance, such as a cloth-like woven fabric formed of glass fiber, metal fiber, carbon fiber or ceramic fiber is used.

By wrapping the fiber member around the flexible element in a hermetically-sealing manner, oxygen supply to the organic material constituting the composite material is blocked and flame resistance is further enhanced. The cloth-like sheet formed of the fiber is preferable to be coated with a non-air-permeable coating material, such as vinyl chloride coating material.

Various ways can be applicable as desired, for wrapping the formed shielding material with a flame-resistant cloth-like sheet, in accordance with the present invention. For example, forming a bag from a flame-resistant cloth-like sheet and hermetically enclosing the formed element of the composite material in the bag, preliminarily wrapping the composite material with the cloth-like sheet and forming together to the final shape, and inserting the formed composite into the aperture of at least two cloth sheets peripherally bound and sealing together, may be adaptable. On sealing the cloth-like sheets, joining the outer peripheries of the cloth-like sheets by stitching using a high-strength nylon, glass-fiber or metal-fiber string, or thermo-compression bonding using a welder, or adhesive bonding or sticking using adhesive.

As the reinforcing member, a laminate film of polyethylene, nylon, polyester or metal, a wire mesh formed of nylon fiber or metal fiber; or a plate- or rod-shaped member having a surface formed with a protrusion are applicable. The use of such reinforcing member allows the shield material to obtain enhanced bending and or shear strength in less volume. Thus, even if the reinforcing member is added, the reduction in density of the shielding element is limited to an extremely small value, and thereby there is almost no deterioration in shielding ability against nuclear or electromagnetic radiation. The reinforcing member may be applied by cutting to be a suitable shape with the shielding material.

As a method for preparing the shielding element and the reinforcing material into a unit by integrating, any suitable method such as keeping the reinforcing member in contact with the shielding element and applying heat onto the contact region therebetween to partly fuse the contact region, adhesively attaching the reinforcing member to the shielding element, or setting the reinforcing member in two or more of the shielding elements and applying heat and pressure to them.

The shielding element integrated with the reinforcing member can be applied to the aforementioned wrapping with the cloth-like sheet to provide enhanced resistance against breakage and cracks during transportation or storage in a folded manner.

BEST MODE FOR CARRYING OUT THE INVENTION

EXAMPLE 1

Figure 1:
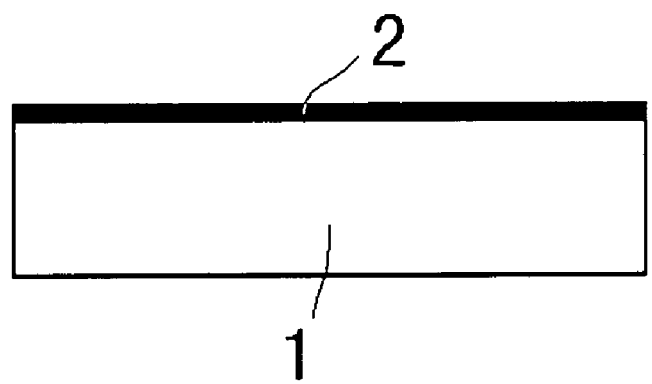
FIG. 1 is a side view showing one example of a shield material of the present invention, wherein a reinforcement member is attached onto one surface of a shielding element.

Table 1 shows various examples where a shield material of the present invention is applied to a nuclear radiation shield.

In Table 1, samples Nos. 1 to 8 are Inventive Examples, and samples Nos. 9 to 13 are Comparative Examples. Table 1 also shows evaluation results of flexibility, shielding ability, flame resistance, environmental impact and handling performance of each sample, and a comprehensive evaluation thereof.

As dispersed particles for providing a nuclear radiation-shielding ability, a tungsten powder, a molybdenum powder and a hafnium oxide each having a particle size of about 0.5 to 100 μm were prepared. Further, as an organic material, an olefin elastomer, a vulcanized rubber, a styrene elastomer, an isoprene elastomer and a polyester elastomer were prepared. Then, each of the organic materials was mixed with each of the dispersed particles at a ratio of about 40 volume %, and the mixture was kneaded to obtain a composite material. The obtained composite material was subjected to warm pressing at a temperature of 140 to 180° C. to form a plate-shaped member of 3 mm×300 mm×1000 mm. Then, as a cloth-like sheet, a glass cloth sheet coated with vinyl chloride, a glass cloth sheet coated with silicon, a carbon fiber sheet coated with silicon, a tungsten wire sheet coated with PTFE (polytetrafluoroethylene), a steel wire sheet coated with PTFE, and a silicon carbide powder-containing nylon sheet coated with silicon were prepared, as shown in Table 1. Each of the cloth-like sheets was formed into a bag or pouch shape having a pocket of 3 mm (thickness)×300 mm×1000 mm. The plate-shaped member was inserted into the pocket of the pouch, and then an opening of the pouch was sewn with a polyester thread to obtain a shield material. Instead of using this shield material as a nuclear radiation shield at a fixed location for a long period of time, a location requiring nuclear radiation shielding was variously changed, and the shield material was formed into various shapes depending on the locations. Specifically, the shield material was used as a nuclear radiation shield during an operation for inspecting various locations in a nuclear power generation facility.

Each of the samples No. 1 to 8 or Inventive Examples were evaluated as adequate in all items of flexibility, shielding ability, flame resistance, environmental impact and handling performance, and exhibited excellent properties as a nuclear radiation shield.

The shield material containing the high-density tungsten powder in Inventive Examples exhibited excellent nuclear radiation shielding performance, which was superior to an X-ray shielding ability of the lead-containing samples Nos. 9 and 10 in equivalent thickness.

The sample No. 11 prepared by filling a vinyl-chloride (hereinafter referred to as "VC" for brevity)-coated glass cloth sheet with an iron powder could not be practically used due to uneven distribution of the powder within the sheet and unevenness in shielding ability over the sheet.

The sample No. 12 having a plate-shaped member formed of a tungsten-elastomer resin composite material and no cloth-like sheet was hardly handled and easily broken due to poor bending and tearing strengths.

The sample No. 13 having a cloth-like sheet made of polyethylene easily caught fire even by short-time contact with flame.

TABLE 1

| Sample No. | Material of plate-shaped member | Material of cloth-like sheet | Flexibility | Shielding Ability | Flame Resistance | Environmental Impact | Handling Performance | Comprehensive Evaluation |
|---|---|---|---|---|---|---|---|---|
| 1 | tungsten powder-olefin elastomer | VC-coated glass cloth sheet | ○ | ○ | ○ | ○ | ○ | ○ |
| 2 | tungsten powder-vulcanized rubber | VC-coated glass cloth sheet | ○ | ○ | ○ | ○ | ○ | ○ |
| 3 | molybdenum powder-olefin elastomer | VC-coated glass cloth sheet | ○ | ○ | ○ | ○ | ○ | ○ |
| 4 | tantalum powder-vulcanized rubber | silicon-coated glass cloth sheet | ○ | ○ | ○ | ○ | ○ | ○ |
| 5 | hafnium oxide powder-vulcanized rubber | silicon-coated carbon fiber sheet | ○ | ○ | ○ | ○ | ○ | ○ |
| 6 | tungsten powder-styrene elastomer | PTFE-coated tungsten wire sheet | ○ | ○ | ○ | ○ | ○ | ○ |
| 7 | tungsten powder-isoprene elastomer | PTFE-coated steel wire sheet | ○ | ○ | ○ | ○ | ○ | ○ |
| 8 | tungsten powder-polyester elastomer | silicon-coated silicon carbide-containing nylon sheet | ○ | ○ | ○ | ○ | ○ | ○ |
| 9 | lead | NON | x | ○ | ○ | x | ○ | x |
| 10 | lead wool | VC glass cloth sheet | ○ | x | ○ | x | ○ | x |
| 11 | tungsten powder | VC glass cloth sheet | ○ | x | ○ | ○ | ○ | x |
| 12 | tungsten powder-olefin elastomer | NON | ○ | ○ | x | ○ | x | x |
| 13 | tungsten powder-olefin elastomer | polyethylene film | ○ | ○ | x | ○ | ○ | x |

EXAMPLE 2

Table 2 shows various examples where a shield material of the present invention is applied to an electromagnetic radiation shield.

In Table 2, examples Nos. 21 to 23 are Inventive Examples. As an electromagnetic radiation-shielding dispersed material, an iron oxide powder and an iron powder were selected. Further, as an organic material, a vulcanized rubber and an olefin elastomer were selected. Then, each of the organic materials was mixed with each of the dispersed materials at a ratio about 40 volume % to form a composite material, and the composite material was treated in the same manner as that in Example 1 to prepare a plate-shaped member of 1 mm×1000 mm×1000 mm.

As a cloth-like sheet, a VC-coated glass cloth sheet was selected, and two of the glass cloth sheets are prepared. Then, the plate-shaped sheet made of the composite material was sandwiched between the glass cloth sheets, and the outer periphery of the glass cloth sheets was integrally joined to the plate-shaped sheet sandwiched therebetween, through thermo-compression bonding using a welder to obtain a shield material.

A plurality of the shield materials were prepared, and used as an electromagnetic radiation shield in such a manner as to be adhesively attached onto an outer wall of a simple electromagnetic radiation shield room.

The shield material is required to have flexibility enough to closely cover the outer wall of the electromagnetic radiation shield room, because the outer wall is formed with a number of protrusions. The shield material is also required to have a high strength against tearing or the like without eliminating the need for paying particular attention to its handling when the location of a target facility is changed, or the shield material is used in another target facility. If the shield material has a low shielding ability per volume, it has to be formed as a thick shield. This is disadvantage in carrying, installation in a facility, or storage thereof. Thus, it is desirable that the shield material has a high shielding ability per volume. In terms of these needs, the samples Nos. 21 to 23 or Inventive Examples were a suitable electromagnetic radiation shield material. In addition, these samples also had excellent non-breakability and flame resistance, as well as adequate flexibility.

In Table 2, samples Nos. 24 to 27 are Comparative Examples. As compared to these Comparative Examples, the samples Nos. 21 to 23 or Inventive Examples were superior as an electromagnetic radiation shield in all items of flexibility, shielding ability, flame resistance, environmental impact and handling performance.

The sample No. 24 prepared by filling a VC-coated glass cloth sheet with an iron powder could not be practically used due to uneven distribution of the powder within the sheet and unevenness in shielding ability over the sheet. The sample No. 25 having a plate-shaped member formed of an iron oxide-elastomer resin composite material and no cloth-like sheet was hardly handled and easily broken. The sample No. 26 having a cloth-like sheet made of polyethylene easily caught fire even by short-time contact with flame. Further, the sample No. 27 having a plate-shaped member formed of an iron plate had poor conformability to surface profiles of facilities, and could be used only in limited facilities having a specific surface profile.

TABLE 2

| Sample No. | Material of plate-shaped member | Material of cloth-like sheet | Flexibility | Shielding Ability | Flame Resistance | Handling Performance | Comprehensive Evaluation |
|---|---|---|---|---|---|---|---|
| 21 | iron oxide powder-vulcanized rubber | VC-coated glass cloth sheet | ○ | ○ | ○ | ○ | ○ |
| 22 | iron oxide powder-olefin elastomer | VC-coated glass cloth sheet | ○ | ○ | ○ | ○ | ○ |
| 23 | iron powder-olefin elastomer | silicon-coated glass cloth sheet | ○ | ○ | ○ | ○ | ○ |
| 24 | iron oxide powder | VC-coated glass cloth sheet | ○ | x | ○ | ○ | x |
| 25 | iron powder-olefin elastomer | NON | ○ | ○ | x | x | x |
| 26 | iron oxide powder-vulcanized rubber | polyethylene | ○ | ○ | x | ○ | x |
| 27 | iron plate | NON | x | ○ | ○ | x | x |

EXAMPLE 3

FIGS. 1 to 5 show various examples of a shield material with a reinforcing member of the present invention.

Figure 2:
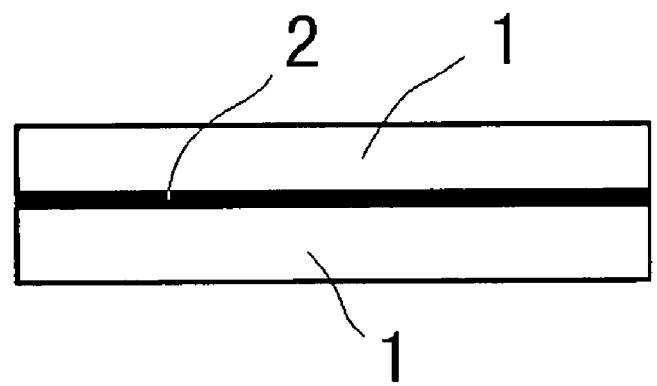
FIG. 2 is a side view showing another example of the shield material of the present invention, wherein a reinforcement member is attached inside a shielding element.

When a shielding element 1 comprises a mixture of particles having a radiation shielding ability and a flexible polymer compound, it additionally includes a reinforcing member 2 integrally attached thereto. The reinforcing member 2 may be attached to the shielding element 1 in the following manners. As shown in FIG. 1, when the reinforcement member 2 has a film shape or a mesh shape, it may be attached onto one surface of the shielding element 1. Alternatively, as shown in FIG. 2, the reinforcement member 2 may be embedded in the inside of the shielding element 1.

Figure 3:
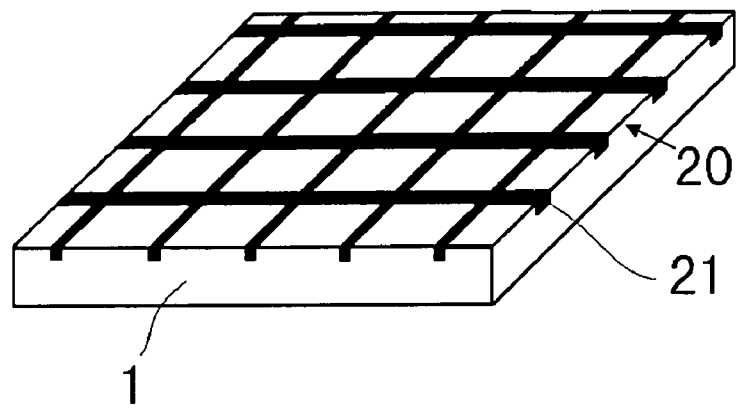
FIG. 3 is a perspective view showing yet another example of the shield material of the present invention, wherein a reinforcement member is attached in the vicinity of one surface of a shielding element.

Further, as shown in FIG. 3, when a reinforcement member 20 has a plurality of protrusions 21 formed on one surface thereof, it may be arranged to allow the protrusions 21 to face downward, and then integrally embedded in the vicinity of one surface of the shielding element 1.

Further, in the reinforcement member 20 having the protrusions 21, the protrusions 21 can control a curvature of the shielding element 1 in such as manner as to prevent the shielding element 1 from being bent beyond a given bending angle in a specific direction, as shown in FIG. 4(b). For example, when the shielding element is formed as a mat-shaped elongated member, this reinforcement member 20 may be attached on the central region of one surface of the elongated member along the longitudinal direction thereof. Thus, even if the elongated member is folded for transfer or storage, a curvature of the folded portion can be maintained at a given value or more to prevent the occurrence of breakage or cracks therein.

In Example 3, a tungsten powder having a high nuclear radiation shielding ability was used as a metal for a shielding element, and an olefin elastomer (thermoplastic elastomer) powder was used as an organic material for the shielding element. These were mixed, heated and pressed to obtain a plate-shaped composite material consisting of 60 volume % of tungsten powder and 40 volume % of olefin elastomer. Further, a cohesive laminate sheet primarily containing a resin component was selected as the reinforcing member, and cut off in conformity to a shape of the plate-shaped composite material to prepare two laminate sheets. Then, the two laminate sheets were adhesively attached, respectively, onto opposite surfaces of the plate-shaped composite material, and integrated with the plate-shaped composite material, to obtain a plate-shaped flexible shield material.

The obtained shield material was used as a curtain of an X-ray fluoroscope for security screening, which has been conventionally made of a lead-containing shield material.

This shield curtain had excellent nuclear radiation-shielding performance based on the high-density tungsten powder contained therein, and exhibited an X-ray shielding ability superior to that of a lead-containing shield in equivalent thickness. The shield curtain also had excellent flexibility, and could be deformed in a bending manner. Further, even if a baggage was a food item, the shield curtain containing no harmful material, such as lead, could be used without a problem about lead pollution of foods. Furthermore, the shield curtain had a higher tearing strength than that of the conventional shield to facilitate attachment, and could obtain a durable term equal to or longer than that of the conventional curtain made of the lead-containing shield material.

EXAMPLE 4

Figure 4:
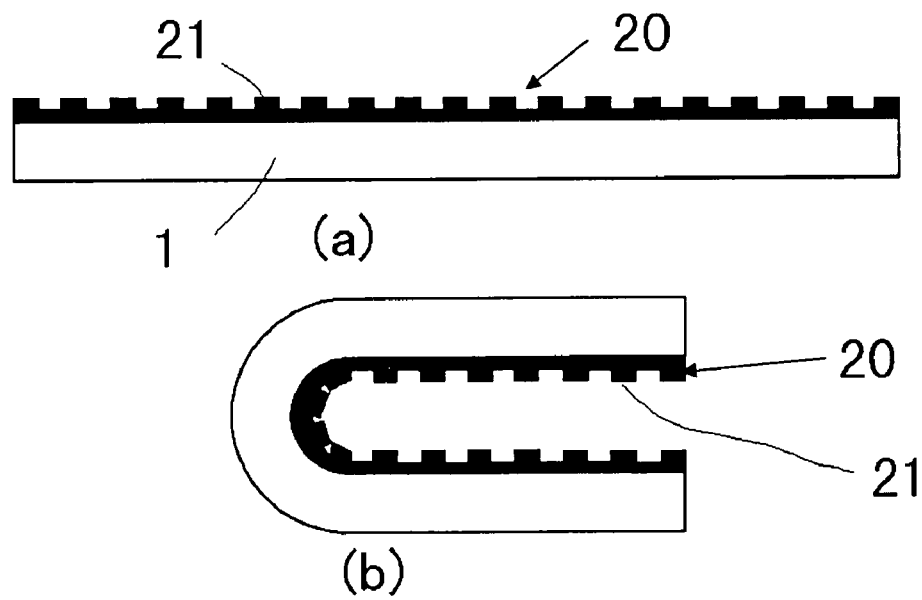
FIG. 4(a) is a side view showing still another example of the shield material of the present invention in a normal state, wherein a reinforcement member capable of being bent only within a given bending angle is attached onto one surface of a shielding element.
FIG. 4(b) is a side view showing the shield material in FIG. 4(a), in the state after being folded.
Figure 5:
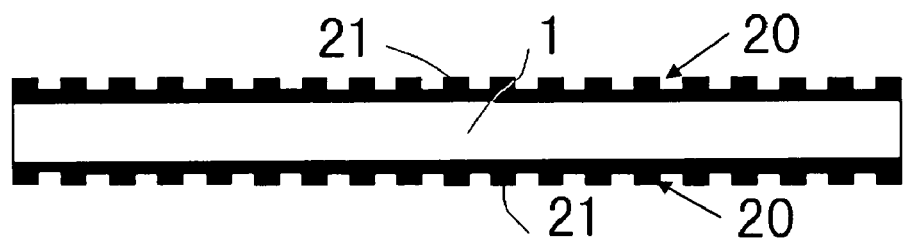
FIG. 5 is a side view showing yet still another example of the shield material of the present invention, wherein the reinforcement member in FIG. 4(a) is attached onto each of opposite surfaces of the shielding element.

As a shielding element, the same plate-shaped composite material as that in Example 3 was selected. Further, as a reinforcing member 20, a resin plate having a plurality of protrusions 21 as shown in FIG. 4 was selected, and cut off in conformity to a size of the plate-shaped composite material to prepare two reinforcing members. Then, the reinforcing members are attached onto the composite material with an adhesive to obtain a shield material 1 having opposite surfaces each formed with a plurality of convex and concave portions defining grooves therebetween, as shown in FIG. 5. The obtained shield material was used as a nuclear radiation shield during an operation for inspecting various locations in a nuclear power generation facility. Instead of using this shield material as a nuclear radiation shield at a fixed location for a long period of time, the nuclear radiation shield was used at various locations to be changed according to the inspection operation.

This shield had flexibility sufficient to be deformed in conformity to various shapes. In addition, when the shield was folded during transport, the reinforcing member allowed the folded portion to reliably have a given curvature or more without cracks in the composite material. Further, the shield had a nuclear-radiation shielding performance which is two times greater than that of a lead wool mat in equivalent thickness.

As a comparative example, the same shielding element without the reinforcing members was used during the inspection operation in the nuclear power generation facility. This shield could not stand long use due to cracks occurring in the composite material during transport.

EXAMPLE 5

A ferrite powder having a high electromagnetic radiation-absorbing capacity was selected as a metal for a shielding element, and a vulcanized rubber powder was used as an organic material for the shielding element. Then, a plate-shaped shielding element consisting of 60 volume % of ferrite and 40 volume % of vulcanized rubber was obtained in the same manner as that in Example 1. This shielding element was formed into a plate shape of 500 mm square by 1 mm thickness. Two of the shielding elements were prepared, and a lattice-shaped copper net having a diameter of 0.05 mm and a pitch of 1 mm was sandwiched between the shielding elements. These three components are heated and pressed from both opposite surfaces, and integrated together to obtain a shield material. The copper net was embedded in the central region of the integrated shielding elements, and firmly joined thereto.

The obtained electromagnetic radiation shield was closely attached onto a wall and ceiling of a simple electromagnetic radiation measurement room. As a result, a noiseless measurement could be performed with a high degree of accuracy, without any external electromagnetic wave with a frequency of 2 MHz or more. The electromagnetic radiation shield had no breakage and crack even though it was bent during attachment and used in this state, and had flexibility conformable to a shape of the measurement room.

INDUSTRIAL APPLICABILITY

The shield material of the present invention can be conveniently attached onto any portion or member requiring shielding against electromagnetic radiation or nuclear radiation from nuclear facilities.

In addition, the shield material of the present invention having no venomousness can be used for various purposes, such as a detection device for a metal remaining in foods, and a curtain of an X-ray baggage screening apparatus in airports.

What is claimed is:

1. A shield material comprising:
   a flexible element formed of a composite material composed of an organic material and dispersed tungsten powder having a nuclear radiation-shielding ability; and
   a cloth-like sheet formed of a flame-resistant fiber selected from the group consisting of glass fiber, metal fiber, carbon fiber, ceramic fiber and mixtures thereof;
   wherein said flexible element is wrapped with said cloth-like sheet.

2. A shield material as defined in claim 1, wherein said cloth-like sheet is coated with an air-impermeable coating material.

3. A shielding material comprising a reinforcing member attached to a shielding element composed of a flexible polymeric organic compound dispersed with tungsten powder having a nuclear radiation-shielding ability;
   wherein said reinforcing member is attached to said shielding element by being compression-bonded thereto.

4. A shielding material comprising a reinforcing member attached to a shielding element composed of a flexible polymeric organic compound in which is dispersed a tungsten powder having a nuclear radiation-shielding ability; wherein said reinforcing member is attached to said shielding element by being compression-bonded thereto between two divided pieces of said shielding element.

5. A shielding material comprising a reinforcing member attached to a shielding element composed of a flexible polymeric organic compound dispersed with tungsten powder having a nuclear radiation-shielding ability, and a cloth-like sheet which is wrapped around and bonded to the integral structure of said shielding element and said attached reinforcing member; wherein said cloth-like sheet is interweaved with a high-strength flame resistant fiber selected from the group consisting of glass fiber, metal fiber, carbon fiber, ceramic fiber and mixtures thereof.

6. A shield material as defined in claim 1, wherein said composite material has about 60% dispersed material and about 40% organic material.

7. A shielding material as defined in claim 3, wherein said flexible polymeric organic compound is composed of one of an elastomeric resin and a vulcanized rubber.

8. A shielding material as defined in claim 3, wherein said reinforcement member is selected from the group consisting of a film made of polyethylene, nylon or metal, and wire mesh formed of nylon fiber or metal fiber.

9. A shielding material as defined in claim 3, wherein said reinforcement member has a surface formed with at least one protrusion and is one of a plate-shaped and rod-shaped member.

10. A shielding material as defined in claim 9, wherein said protrusion prevents the shielding element from being bent beyond a given bending angle.

11. A shielding material as defined in claim 5, wherein said cloth-like sheet is coated with an air-impermeable coating material.

* * * * *